US010062618B2

(12) United States Patent
Ando et al.

(10) Patent No.: US 10,062,618 B2
(45) Date of Patent: Aug. 28, 2018

(54) METHOD AND STRUCTURE FOR FORMATION OF REPLACEMENT METAL GATE FIELD EFFECT TRANSISTORS

(71) Applicant: GLOBALFOUNDRIES Inc., Grand Cayman (KY)

(72) Inventors: Takashi Ando, Tuckahoe, NY (US); Aritra Dasgupta, Wappingers Falls, NY (US); Balaji Kannan, Fishkill, NY (US); Unoh Kwon, Fishkill, NY (US)

(73) Assignee: GLOBALFOUNDRIES, INC., Grandy Cayman (KY)

( * ) Notice: Subject to any disclaimer, the term of this patent is extended or adjusted under 35 U.S.C. 154(b) by 61 days.

(21) Appl. No.: 14/721,402

(22) Filed: May 26, 2015

(65) Prior Publication Data

US 2016/0351453 A1    Dec. 1, 2016

(51) Int. Cl.
| | |
|---|---|
| *H01L 27/11* | (2006.01) |
| *H01L 21/8238* | (2006.01) |
| *H01L 21/324* | (2006.01) |
| *H01L 27/092* | (2006.01) |
| *H01L 29/423* | (2006.01) |
| *H01L 29/49* | (2006.01) |

(52) U.S. Cl.
CPC .... *H01L 21/823857* (2013.01); *H01L 21/324* (2013.01); *H01L 21/823842* (2013.01); *H01L 27/0922* (2013.01); *H01L 29/42372* (2013.01); *H01L 29/4966* (2013.01)

(58) Field of Classification Search
CPC ...................... H01L 21/324; H01L 21/823842
See application file for complete search history.

(56) References Cited

U.S. PATENT DOCUMENTS

| | | | |
|---|---|---|---|
| 7,838,908 B2 | 11/2010 | Kwon et al. | |
| 8,309,419 B2 | 11/2012 | Schaeffer et al. | |
| 8,378,498 B2 | 2/2013 | Blackshear | |
| 8,420,473 B2 | 4/2013 | Ando et al. | |
| 8,445,344 B2 | 5/2013 | Carter et al. | |
| 8,450,946 B1 | 5/2013 | Lunn et al. | |
| 8,581,351 B2 | 11/2013 | Ando et al. | |
| 2009/0014812 A1* | 1/2009 | Wang | H01L 21/82385 257/392 |
| 2012/0061772 A1 | 3/2012 | Guo et al. | |
| 2012/0280288 A1 | 11/2012 | Ando et al. | |
| 2013/0049123 A1 | 2/2013 | Baars et al. | |
| 2013/0082332 A1 | 4/2013 | Liu et al. | |
| 2013/0161764 A1 | 6/2013 | Wong et al. | |
| 2013/0187236 A1* | 7/2013 | Xie | H01L 29/4966 257/369 |
| 2013/0256802 A1 | 10/2013 | Jagannathan et al. | |

(Continued)

*Primary Examiner* — Joseph C Nicely
*Assistant Examiner* — Lamont Koo
(74) *Attorney, Agent, or Firm* — George S. Blasiak, Esq.; Heslin Rothenberg Farley & Mesiti, P.C.

(57) ABSTRACT

Embodiments of the present invention provide a process that maintains a "keep cap" metal nitride layer on PFET devices within a CMOS structure. The keep cap metal nitride layer is in place while an N-type work function metal is formed on the NFET devices within the CMOS structure. A sacrificial rare earth oxide layer, such as a lanthanum oxide layer is used to facilitate removal of the n-type work function metal selective to the keep cap metal nitride layer.

20 Claims, 17 Drawing Sheets

(56) References Cited

U.S. PATENT DOCUMENTS

| | | | |
|---|---|---|---|
| 2013/0299914 A1* | 11/2013 | Kim | H01L 27/092 257/369 |
| 2014/0061813 A1* | 3/2014 | Yu | H01L 27/1104 257/369 |
| 2014/0131808 A1 | 5/2014 | Ando et al. | |

* cited by examiner

US 10,062,618 B2

METHOD AND STRUCTURE FOR FORMATION OF REPLACEMENT METAL GATE FIELD EFFECT TRANSISTORS

FIELD OF THE INVENTION

The present invention relates generally to semiconductor fabrication, and more particularly, to transistor gate structures and methods of formation.

BACKGROUND OF THE INVENTION

Continued development of new electronic devices has demanded increased performance from field effect transistors. Field effect transistors (FETs) are widely used for computing, switching, amplification, filtering, and other tasks related to both analog and digital electrical signals. Most common among these are metal-oxide-semiconductor (MOS) field-effect transistors (MOSFETs), in which a gate structure is energized to create an electric field in an underlying channel region of a semiconductor body, by which electrons or holes are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and other circuitry. Continuing trends in semiconductor device manufacturing include reduction in electrical device feature sizes as well as improvements in device performance in terms of device switching speed and power consumption. It is therefore desirable to have improvements in the fabrication of transistors to support these trends.

SUMMARY OF THE INVENTION

In a first aspect, embodiments of the present invention provide a method of forming a semiconductor structure, comprising: forming an interfacial dielectric layer on a semiconductor substrate, wherein the semiconductor substrate comprises a HVNLVP region and a LVNHVP region; forming a first metal nitride layer on the interfacial dielectric layer; forming a first sacrificial rare earth oxide layer on the first metal nitride layer; forming a second metal nitride layer on the first sacrificial rare earth oxide layer; removing the second metal nitride layer, the first sacrificial rare earth oxide layer, and the first metal nitride layer from the LVNHVP region to expose the interfacial dielectric layer; removing the second metal nitride layer from the HVNLVP region; forming a gate stack dopant rare earth oxide layer on the LVNHVP region and the HVNLVP region; removing the gate stack dopant rare earth oxide layer from the HVNLVP region; performing an anneal; forming a second sacrificial rare earth oxide layer on the LVNHVP region and the HVNLVP region; exposing the interfacial dielectric layer in an HVNLVP NFET subregion and an LVNHVP NFET subregion; forming an N-type work function metal layer in the HVNLVP NFET subregion and the LVNHVP NFET subregion; and forming a P-type work function metal layer in an HVNLVP PFET subregion and an LVNHVP PFET subregion.

In a second aspect, embodiments of the present invention provide a semiconductor structure, comprising: a semiconductor substrate, wherein the semiconductor substrate comprises an HVNLVP region and an LVNHVP region, and wherein the HVNLVP region comprises an NFET subregion and a PFET subregion, and wherein the LVNHVP region comprises an NFET subregion and a PFET subregion; an interfacial dielectric layer disposed on the semiconductor substrate; an N-type work function metal layer disposed on the NFET subregion of the HVNLVP region and on the NFET subregion of the LVNHVP region; a P-type work function metal layer disposed on the PFET subregion of the HVNLVP region and on the PFET subregion of the LVNHVP region; and a fill metal disposed over the HVNLVP region and the LVNHVP region.

In a third aspect, embodiments of the present invention provide a semiconductor structure, comprising: a semiconductor substrate, wherein the semiconductor substrate comprises an HVNLVP region and an LVNHVP region, and wherein the HVNLVP region comprises an NFET subregion and a PFET subregion, and wherein the LVNHVP region comprises an NFET subregion and a PFET subregion; an interfacial dielectric layer disposed on the semiconductor substrate; an N-type work function metal layer disposed on the NFET subregion of the HVNLVP region and on the NFET subregion of the LVNHVP region, wherein the N-type work function metal layer comprises a first sublayer of titanium nitride, a second sublayer comprising aluminum, and a third sublayer of titanium nitride; a P-type work function metal layer disposed on the PFET subregion of the HVNLVP region, and also disposed on the PFET subregion of the LVNHVP region; and a fill metal disposed over the HVNLVP region and the LVNHVP region.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
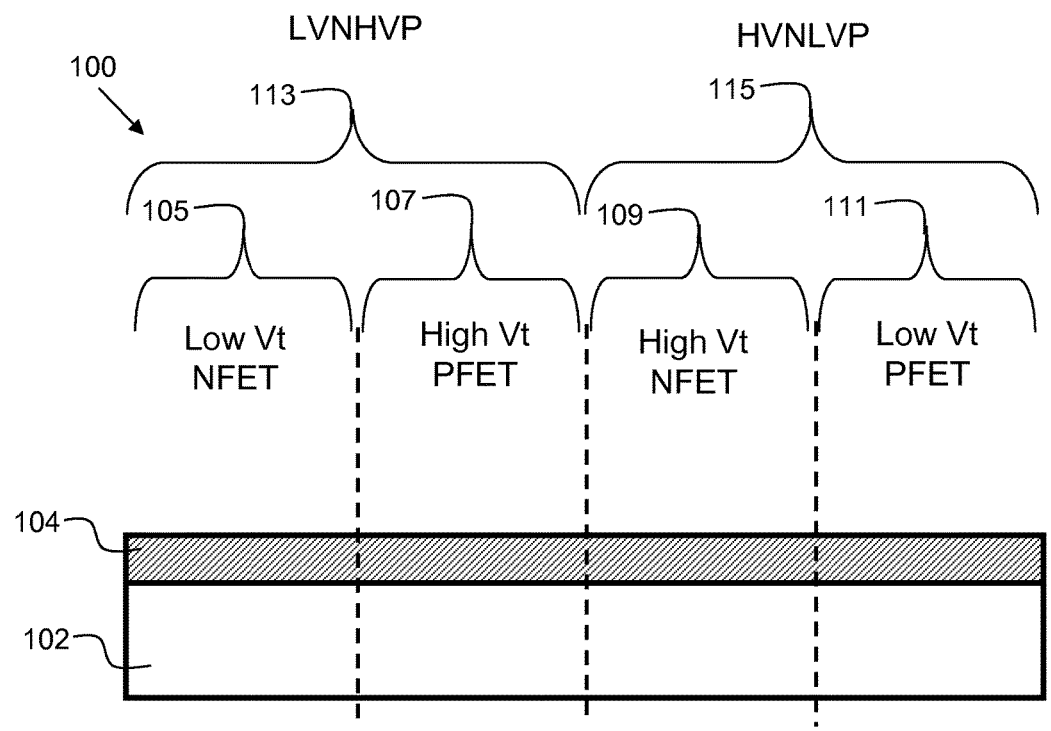

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a semiconductor structure at a starting point for embodiments of the present invention.

Figure 2:
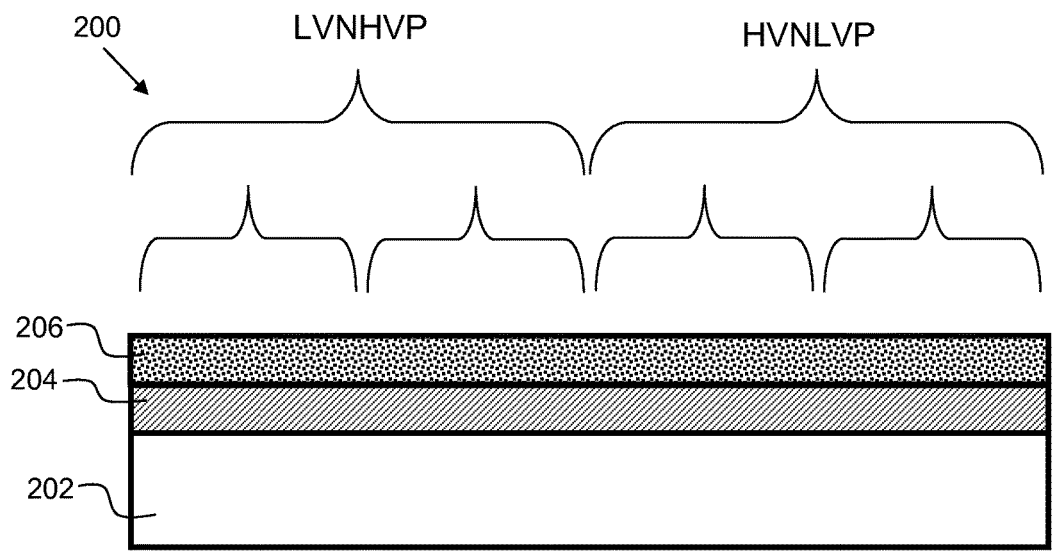

FIG. 2 is a semiconductor structure after a subsequent process step of forming a first metal nitride layer on the interfacial dielectric layer.

Figure 3:
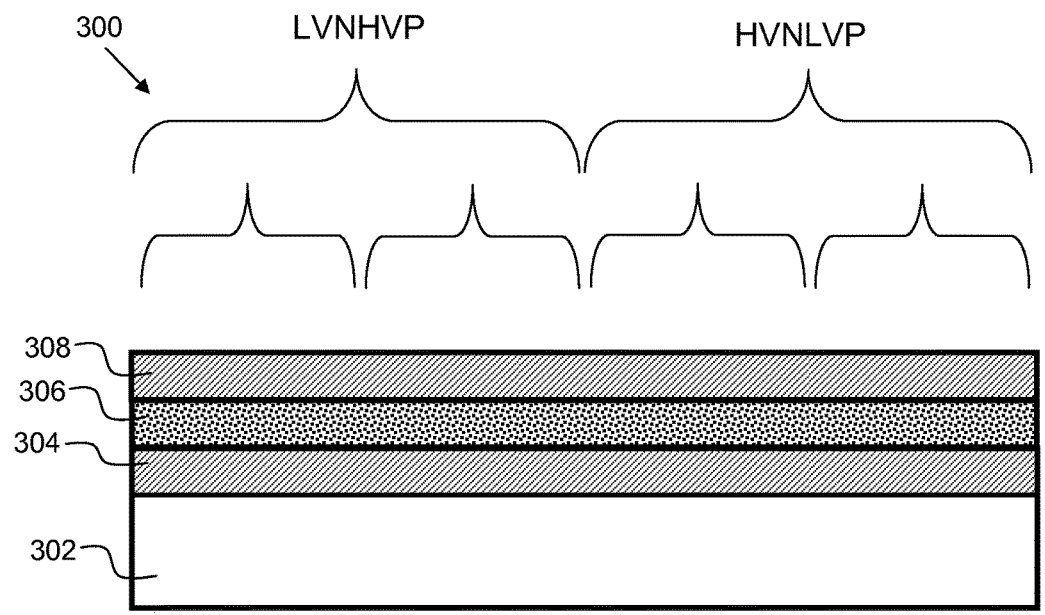

FIG. 3 is a semiconductor structure after a subsequent process step of forming a first sacrificial rare earth oxide layer on the first metal nitride layer.

Figure 4:
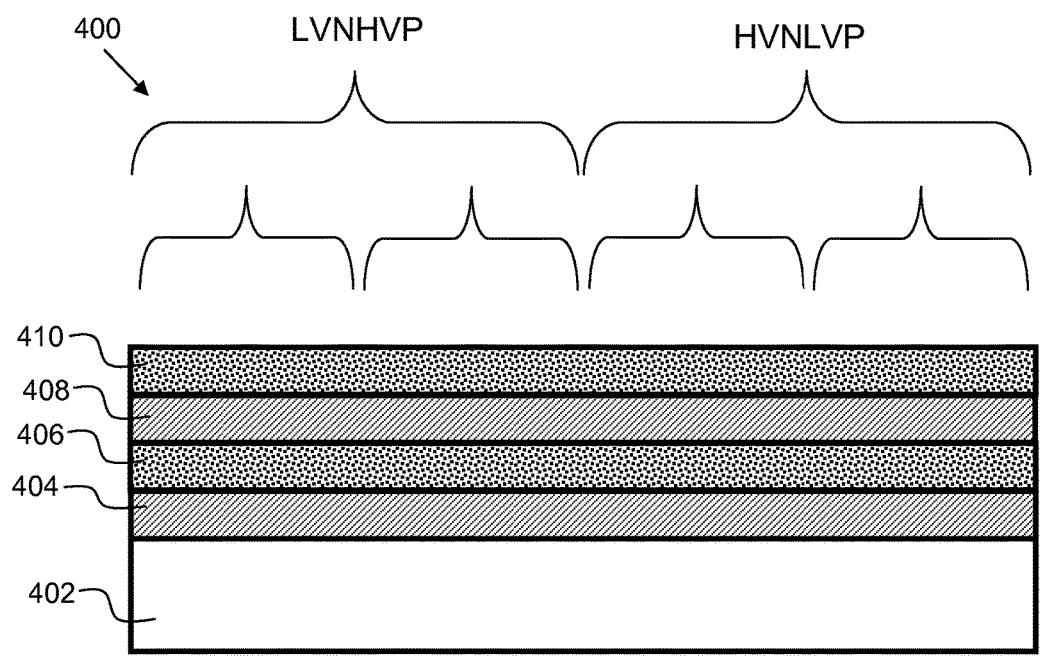

FIG. 4 is a semiconductor structure after a subsequent process step of forming a second metal nitride layer on the first sacrificial rare earth oxide layer.

Figure 5:
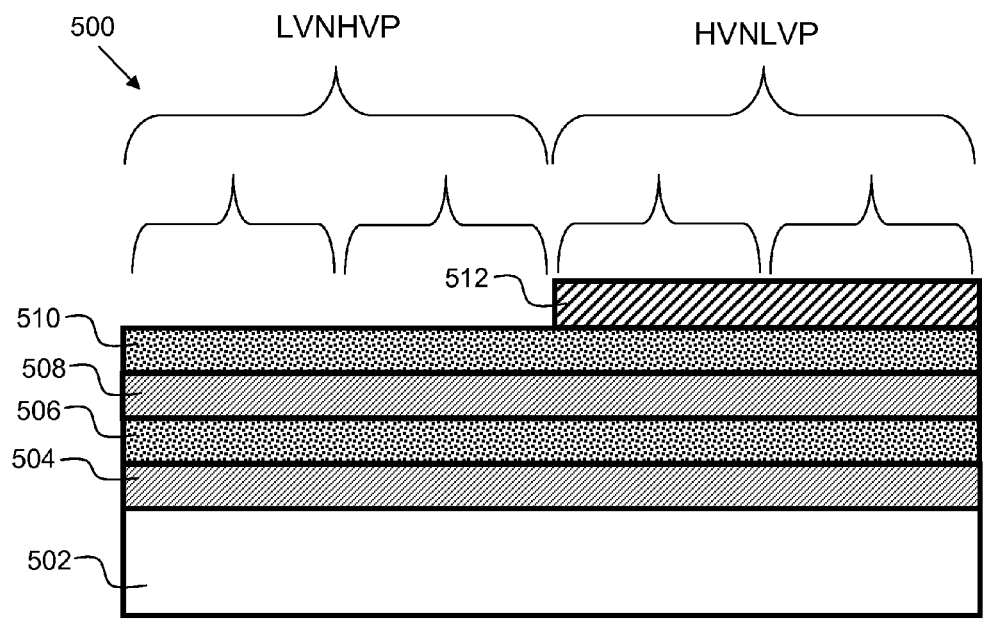

FIG. 5 is a semiconductor structure after a subsequent process step of forming a mask on the HVNLVP region of the semiconductor structure.

Figure 6:
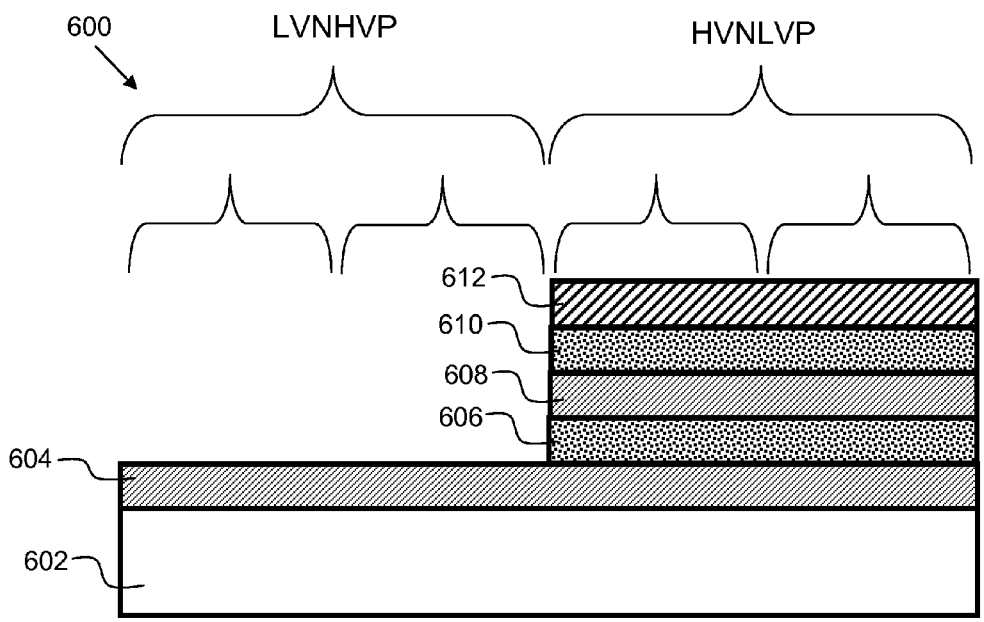

FIG. 6 is a semiconductor structure after a subsequent process step of removing the second metal nitride layer, the first sacrificial rare earth oxide layer, and the first metal nitride layer from the LVNHVP region.

Figure 7:
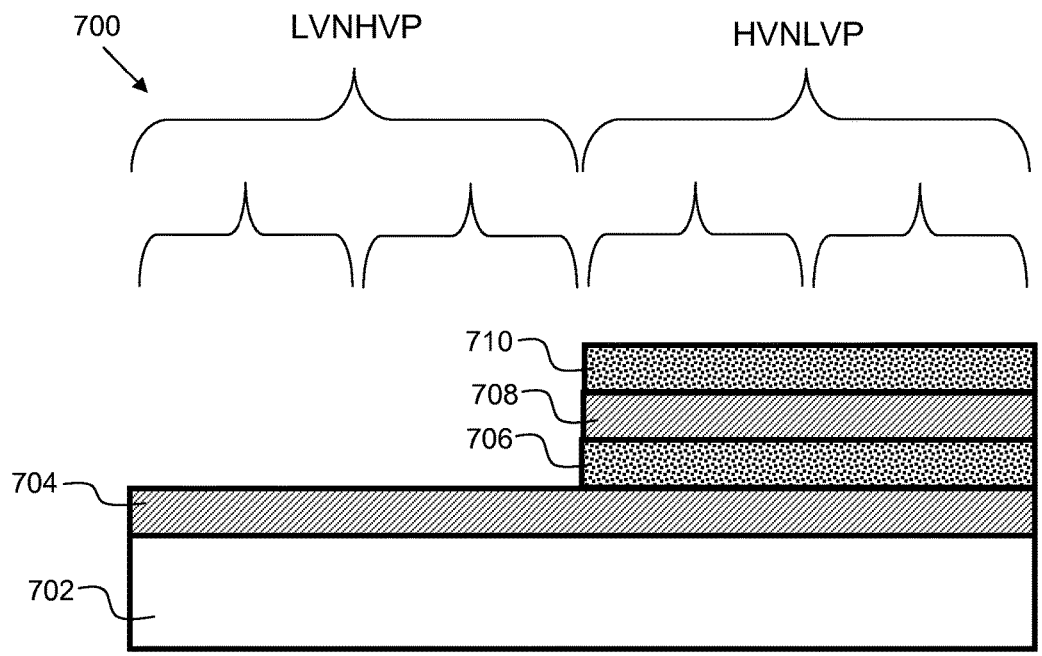

FIG. 7 is a semiconductor structure after a subsequent process step of removing the mask on the HVNLVP region of the semiconductor structure.

Figure 8:
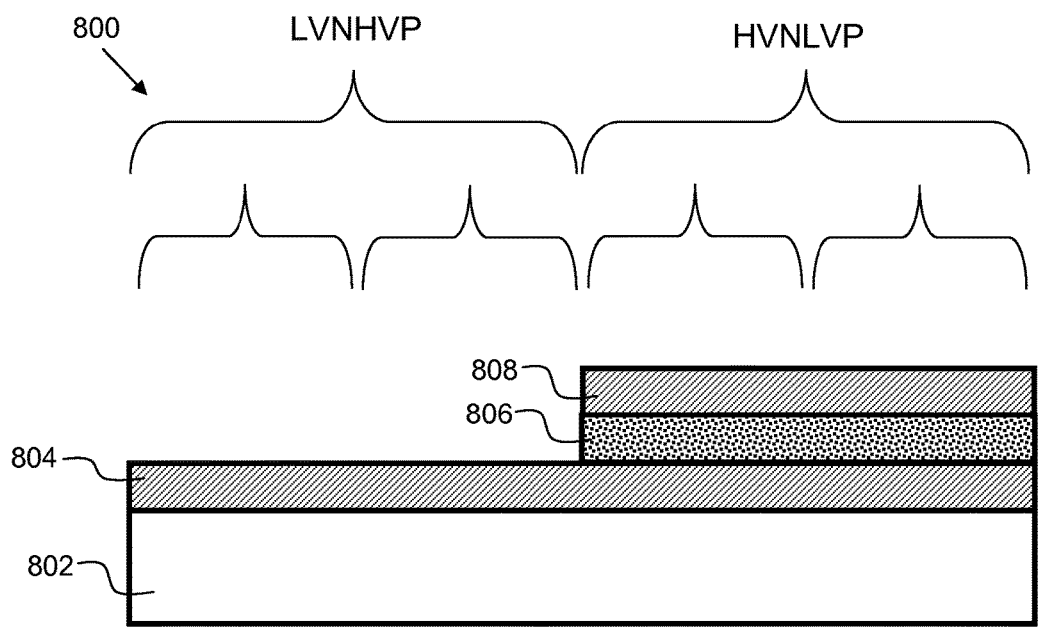

FIG. 8 is a semiconductor structure after a subsequent process step of removing the second metal nitride layer from the HVNLVP region.

Figure 9:
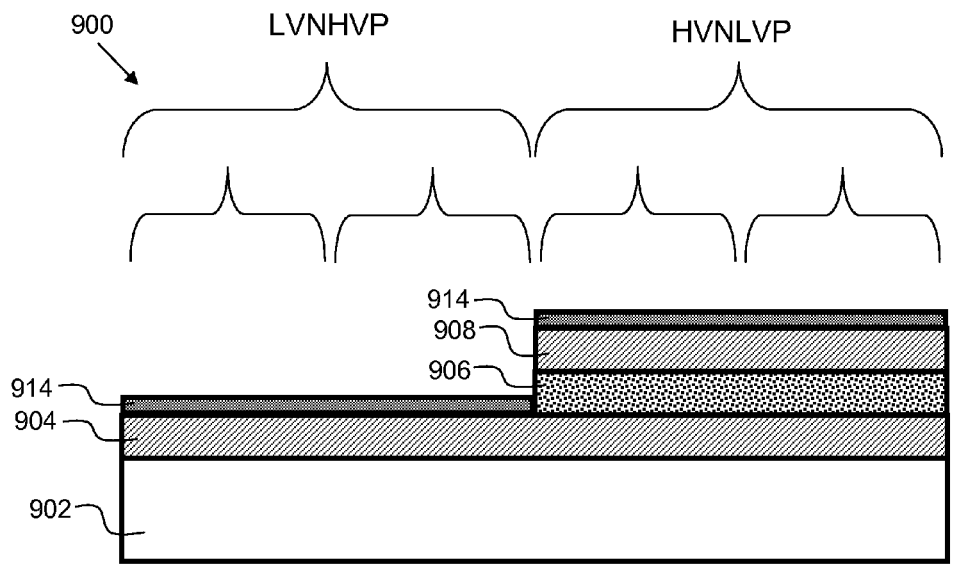

FIG. 9 is a semiconductor structure after a subsequent process step of forming a gate stack dopant rare earth oxide layer on the LVNHVP region and HVNLVP region.

Figure 10:
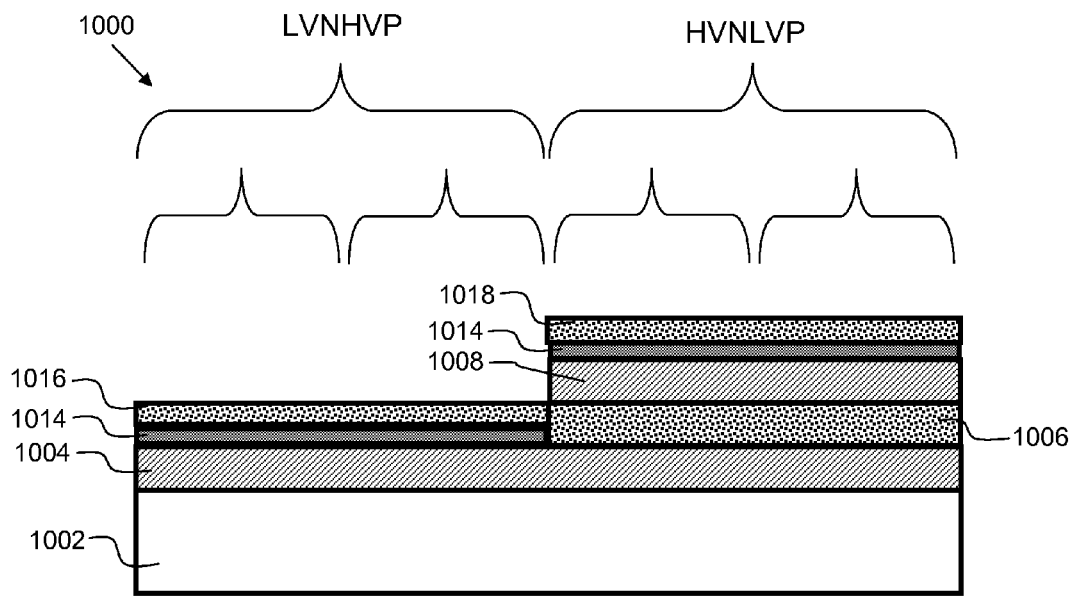

FIG. 10 is a semiconductor structure after a subsequent process step of forming a third metal nitride layer.

Figure 11:
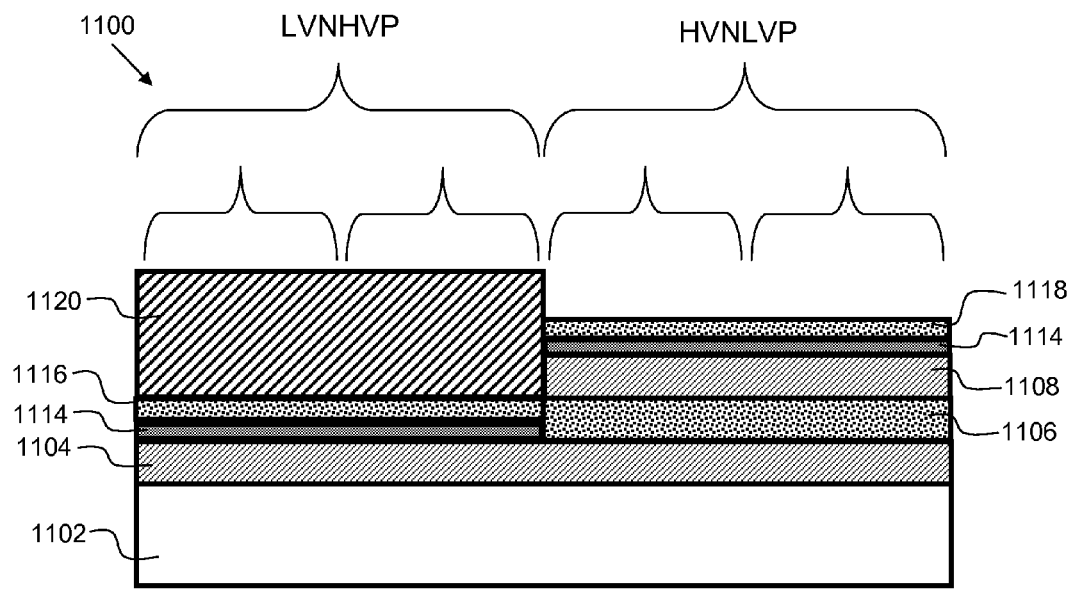

FIG. 11 is a semiconductor structure after a subsequent process step of forming a mask on the LVNHVP region of the semiconductor structure.

Figure 12:
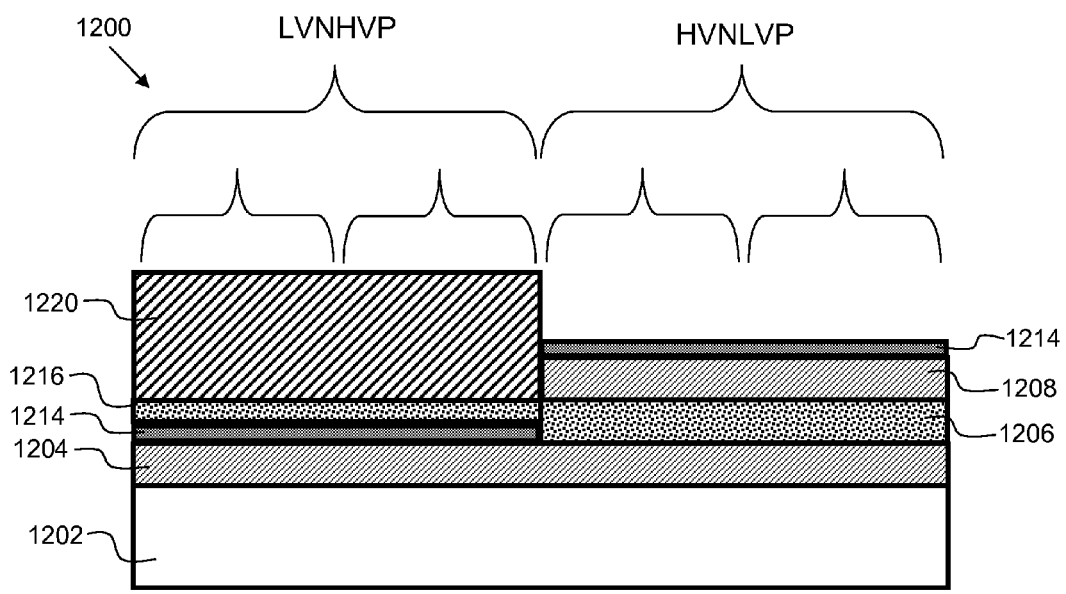

FIG. 12 is a semiconductor structure after a subsequent process step of removing the third metal nitride layer.

Figure 13:
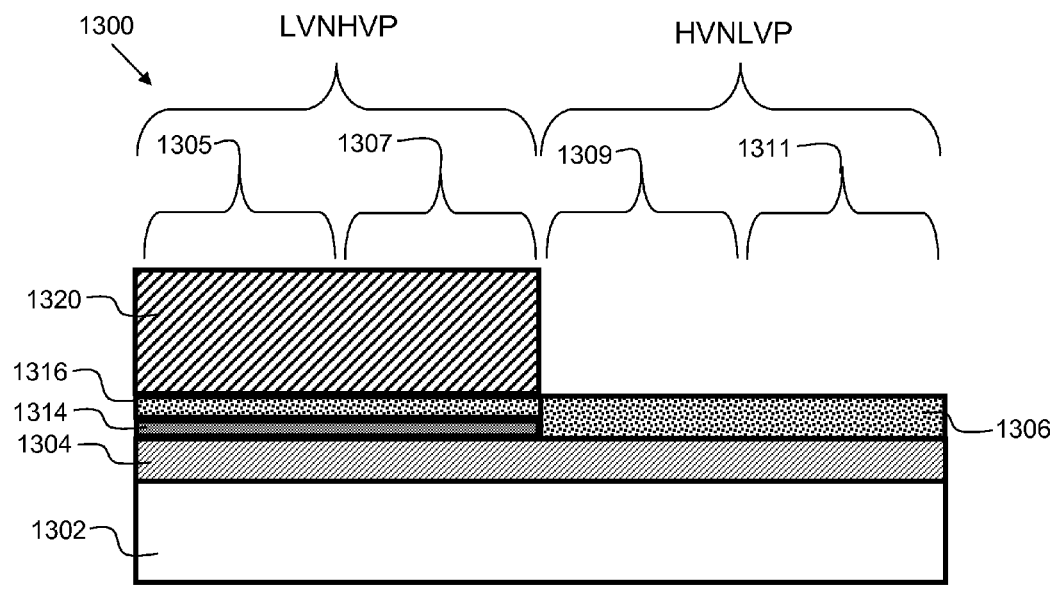

FIG. 13 is a semiconductor structure after a subsequent process step of removing the gate stack dopant rare earth oxide layer and first sacrificial rare earth oxide layer from the HVNLVP region.

Figure 14:
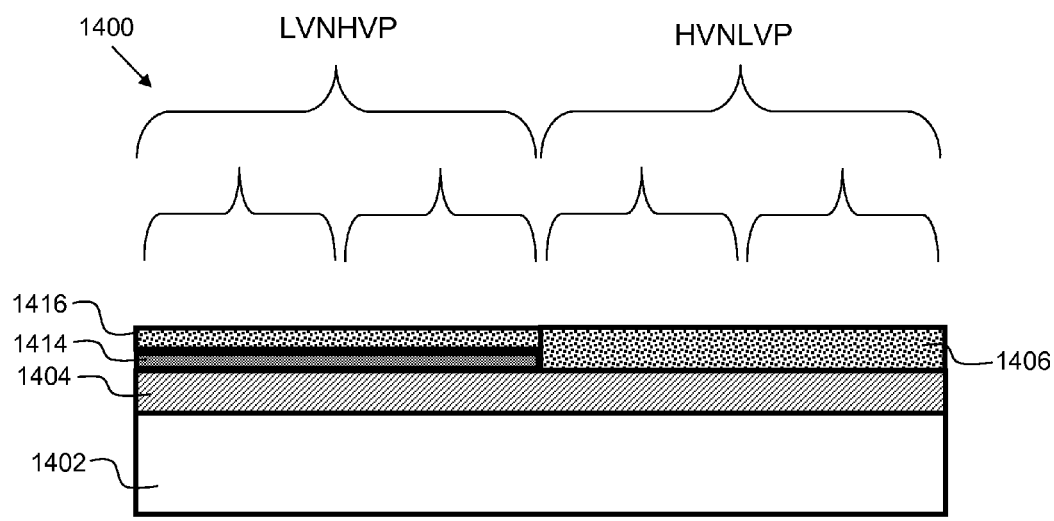

FIG. 14 is a semiconductor structure after a subsequent process step of removing the mask on the LVNHVP region of the semiconductor structure.

Figure 15:
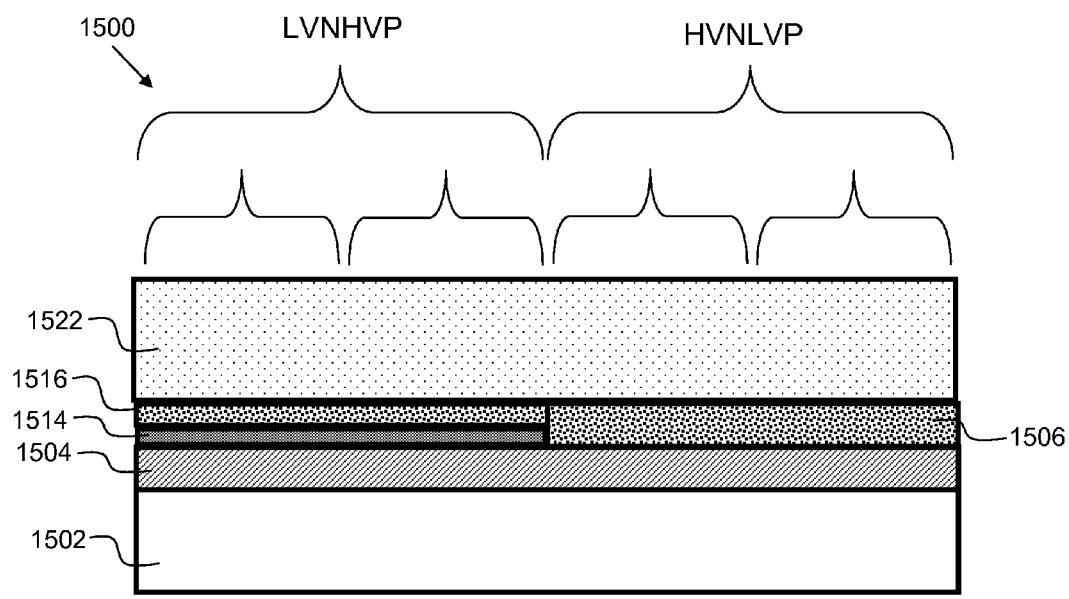

FIG. 15 is a semiconductor structure after a subsequent process step of depositing a layer of amorphous silicon on the LVNHVP region and HVNLVP region.

Figure 16:
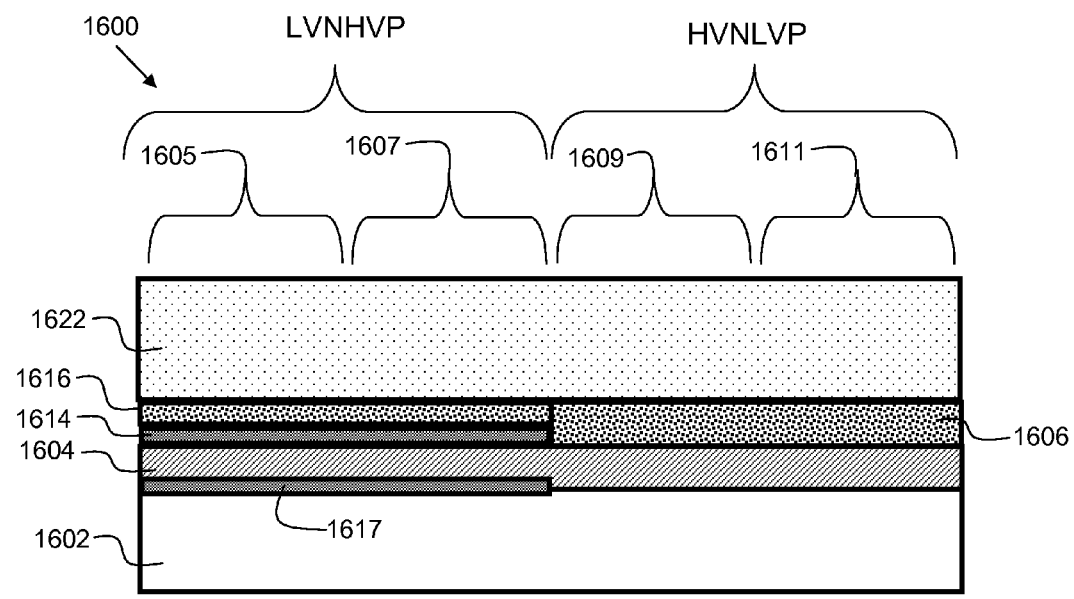

FIG. 16 is a semiconductor structure after a subsequent process step of performing an anneal.

Figure 17:
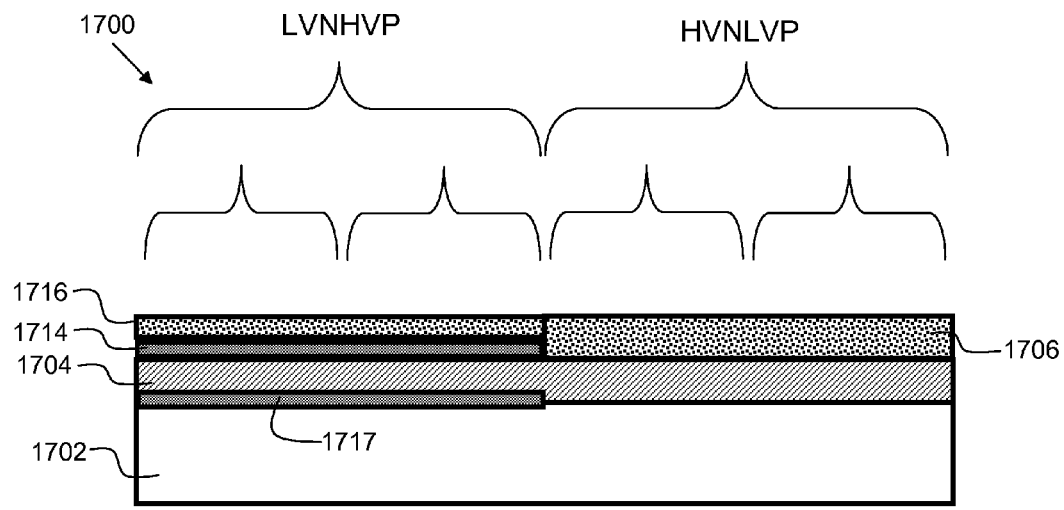

FIG. 17 is a semiconductor structure after a subsequent process step of removing the layer of amorphous silicon on the LVNHVP region and HVNLVP region.

Figure 18:
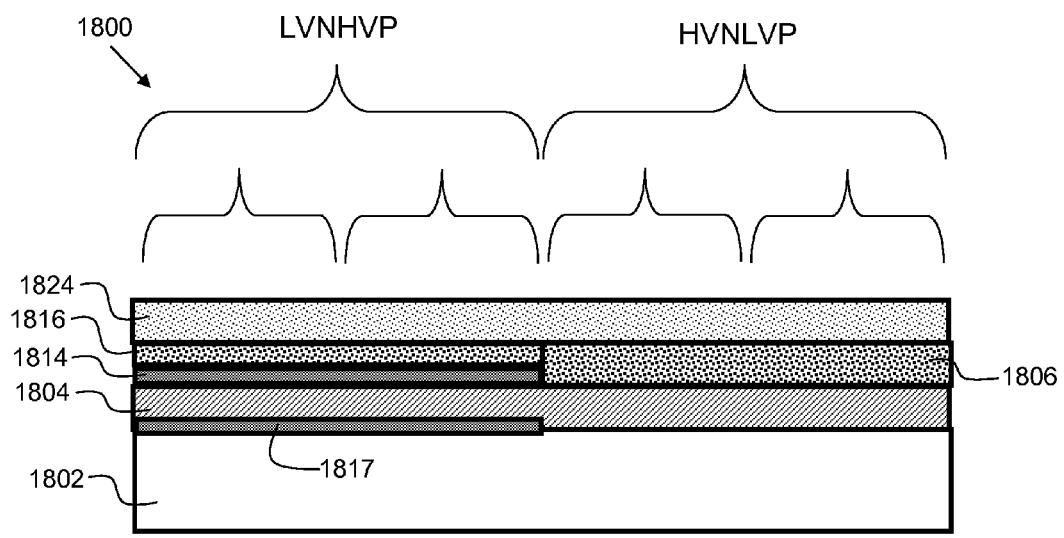

FIG. 18 is a semiconductor structure after a subsequent process step of forming a second sacrificial rare earth oxide layer on the LVNHVP region and HVNLVP region.

Figure 19:
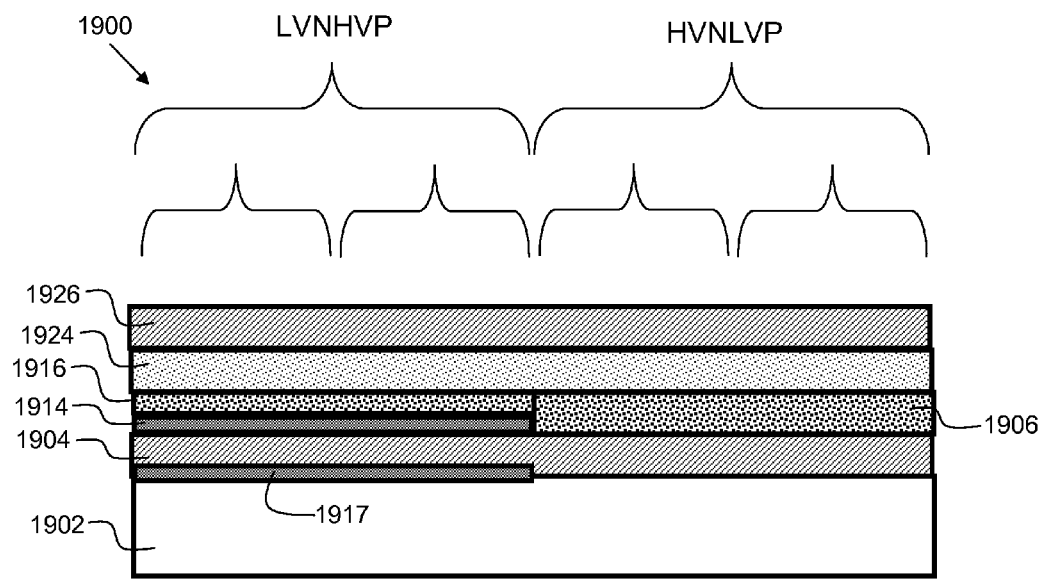

FIG. 19 is a semiconductor structure after a subsequent process step of forming a fourth metal nitride layer.

Figure 20:
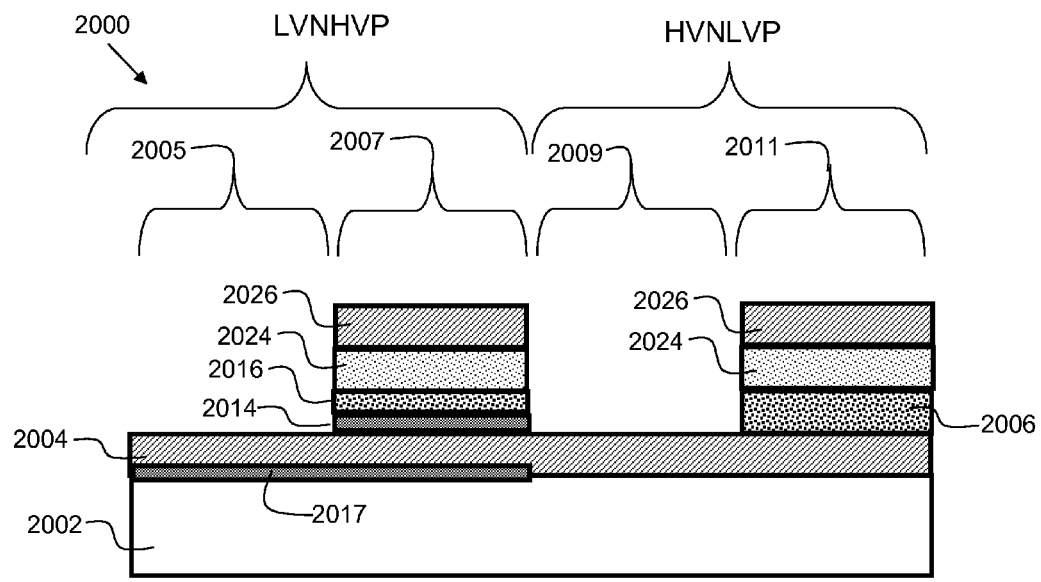

FIG. 20 is a semiconductor structure after a subsequent process step of exposing the interfacial dielectric layer in an HVNLVP NFET subregion and an LVNHVP NFET subregion.

Figure 21:
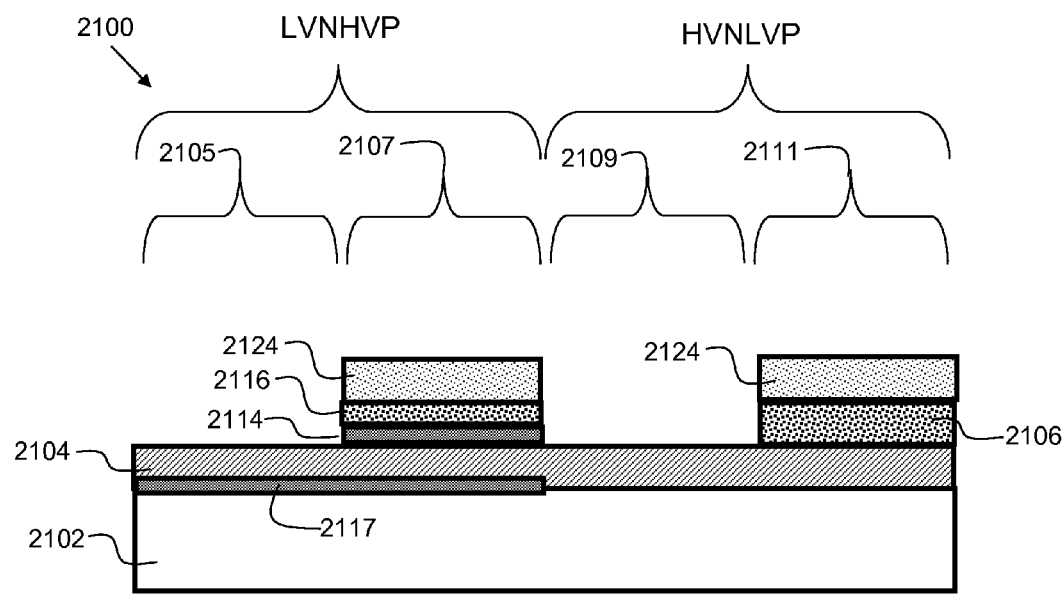

FIG. 21 is a semiconductor structure after a subsequent process step of removing the fourth metal nitride layer.

Figure 22:
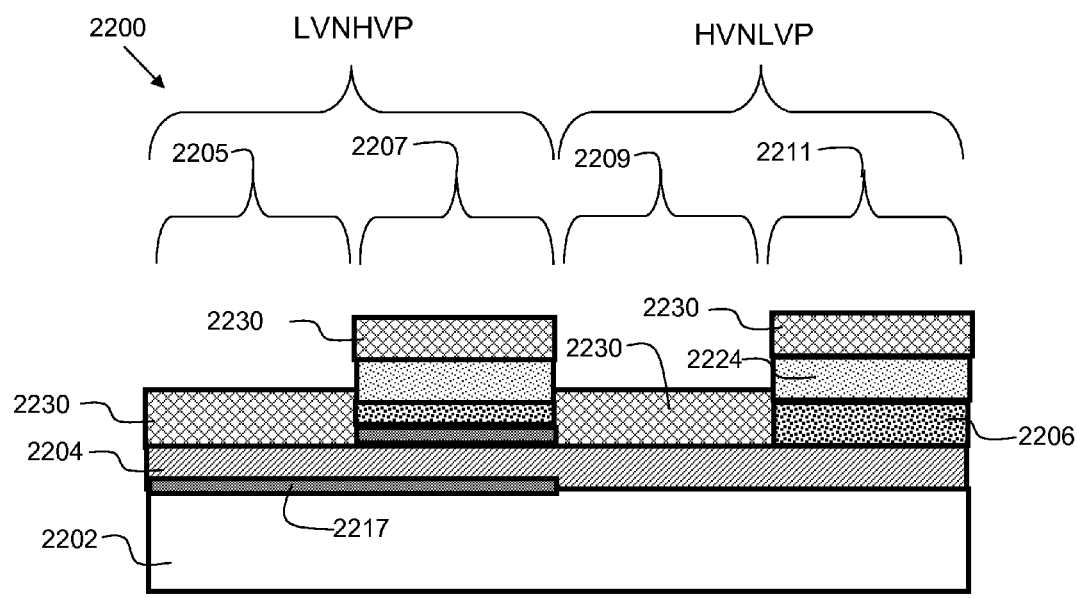

FIG. 22 is a semiconductor structure after a subsequent process step of forming an N-type work function metal layer in the HVNLVP NFET subregion and the LVNHVP NFET subregion.

Figure 23:
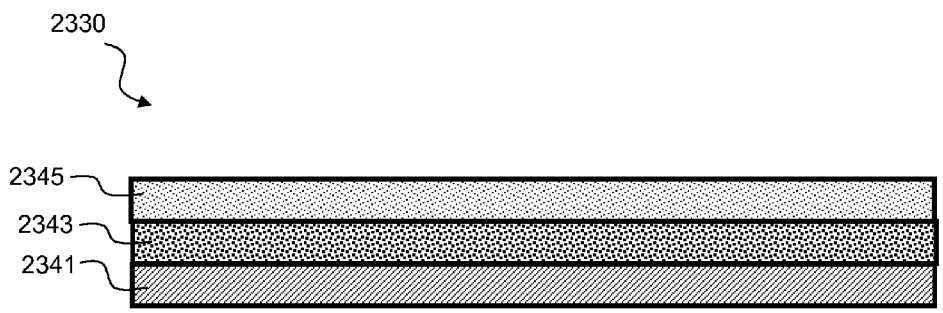

FIG. 23 is a detailed view of an N-type work function metal layer stack in accordance with some embodiments.

Figure 24:
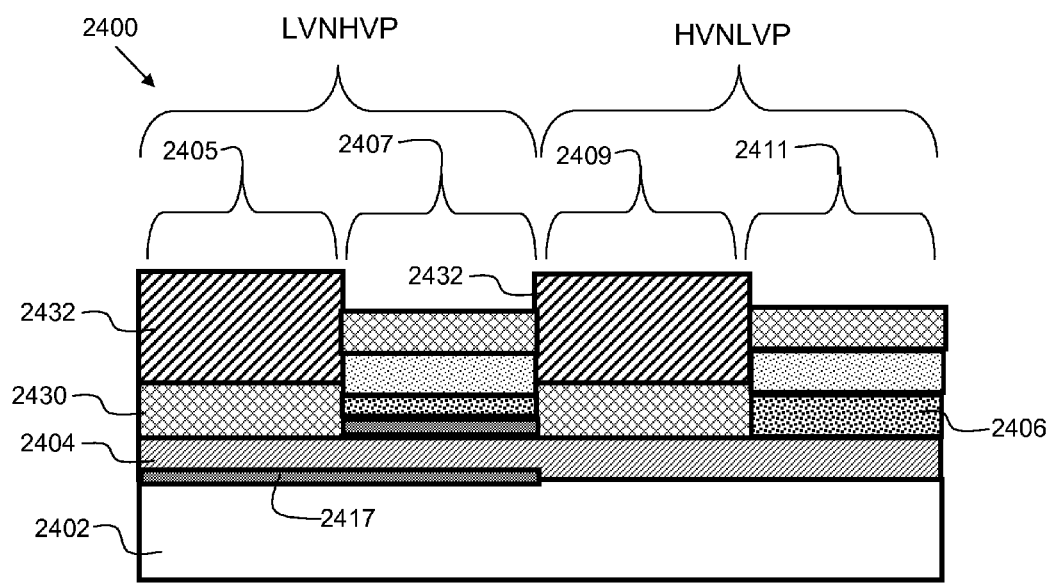

FIG. 24 is a semiconductor structure after a subsequent process step of forming a mask on the HVNLVP NFET subregion and the LVNHVP NFET subregion.

Figure 25:
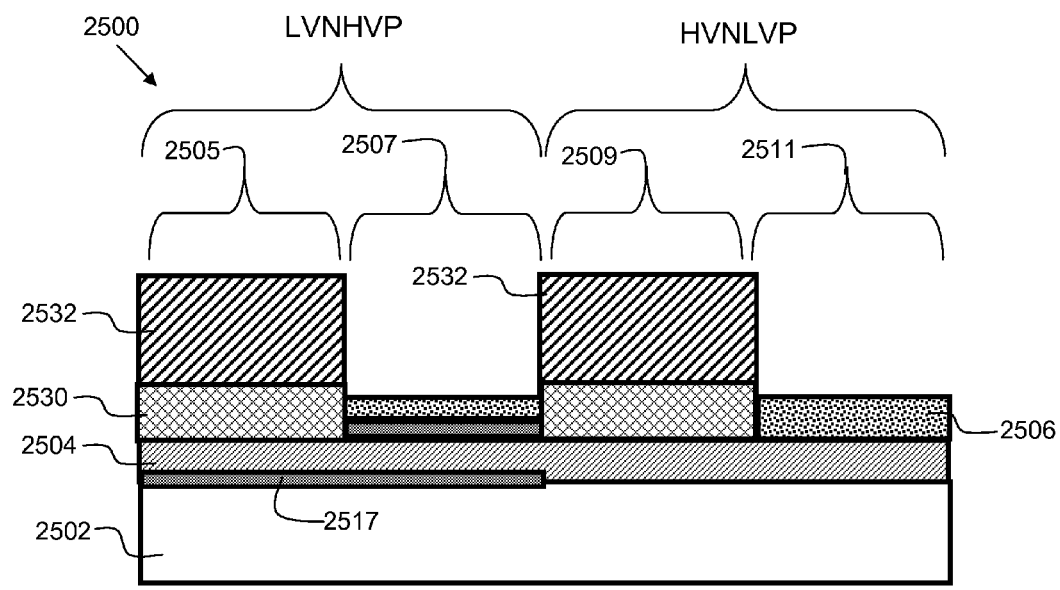

FIG. 25 is a semiconductor structure after a subsequent process step of removing the N-type work function metal layer from the HVNLVP PFET subregion and the LVNHVP PFET subregion.

Figure 26:
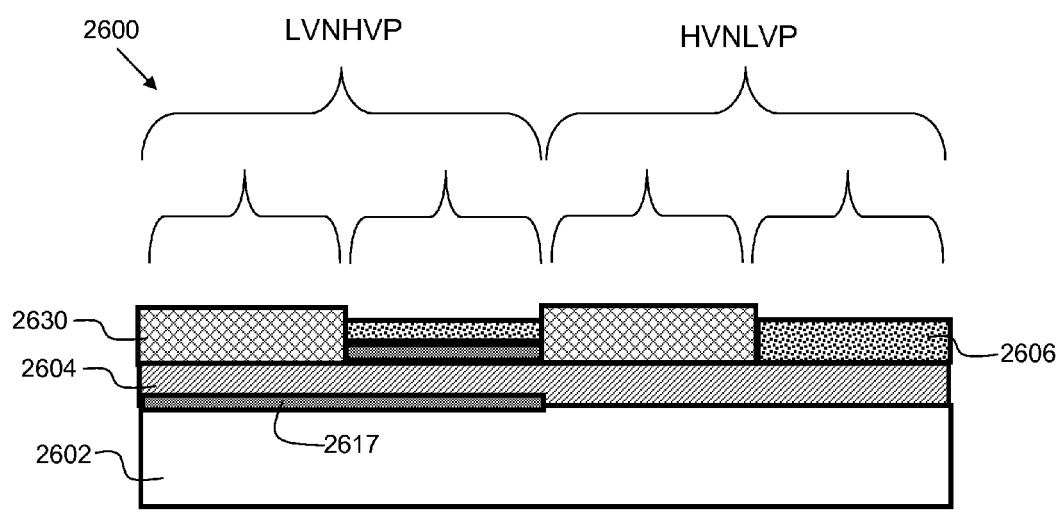

FIG. 26 is a semiconductor structure after a subsequent process step of removing the mask on the HVNLVP NFET subregion and the LVNHVP NFET subregion.

Figure 27:
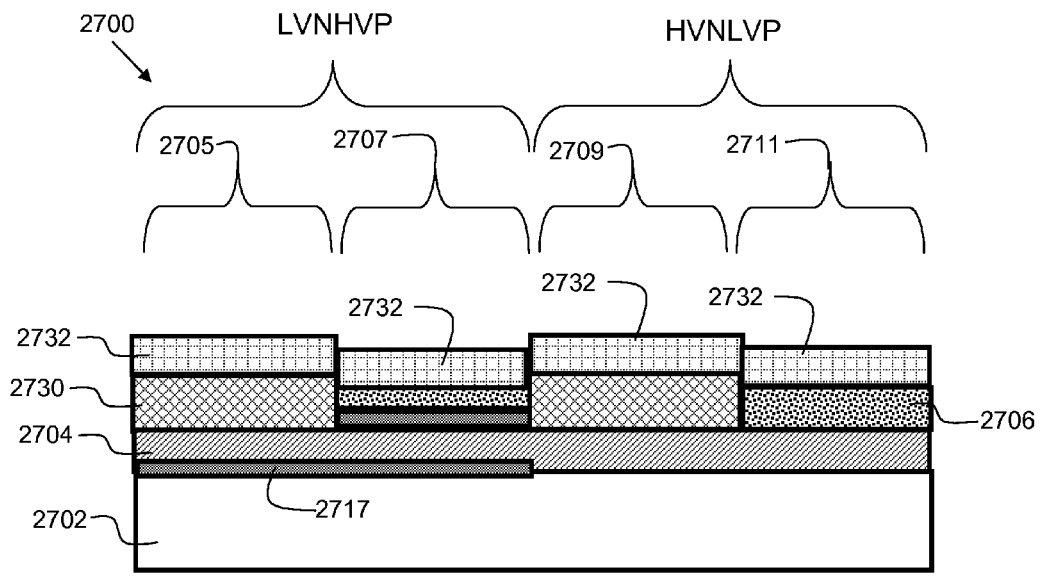

FIG. 27 is a semiconductor structure after a subsequent process step of forming a P-type work function metal layer in the HVNLVP PFET subregion and the LVNHVP PFET subregion.

Figure 28:
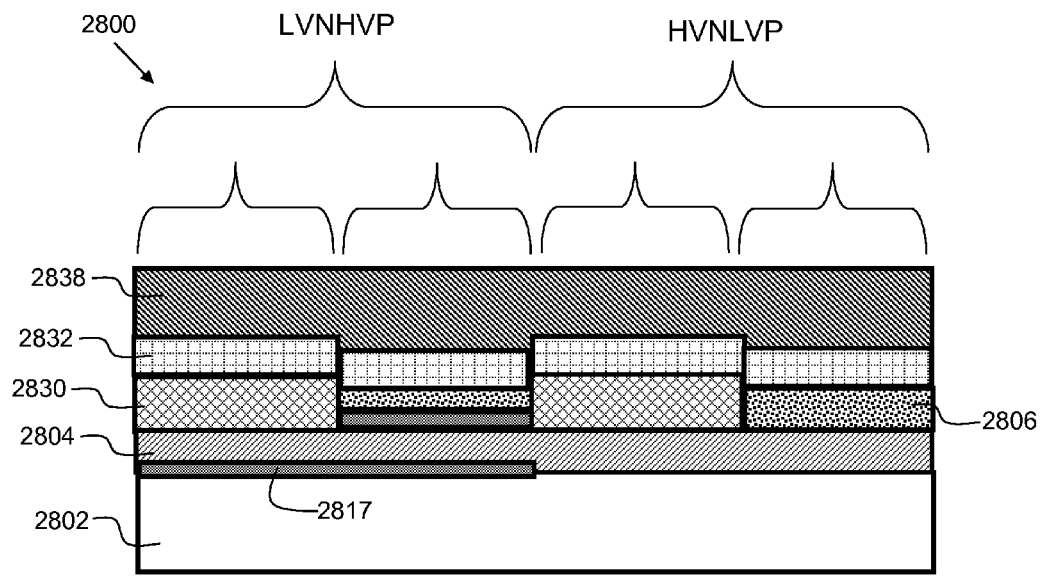

FIG. 28 is a semiconductor structure after a subsequent process step of depositing a fill metal on the LVNHVP region and HVNLVP region.

Figure 29:
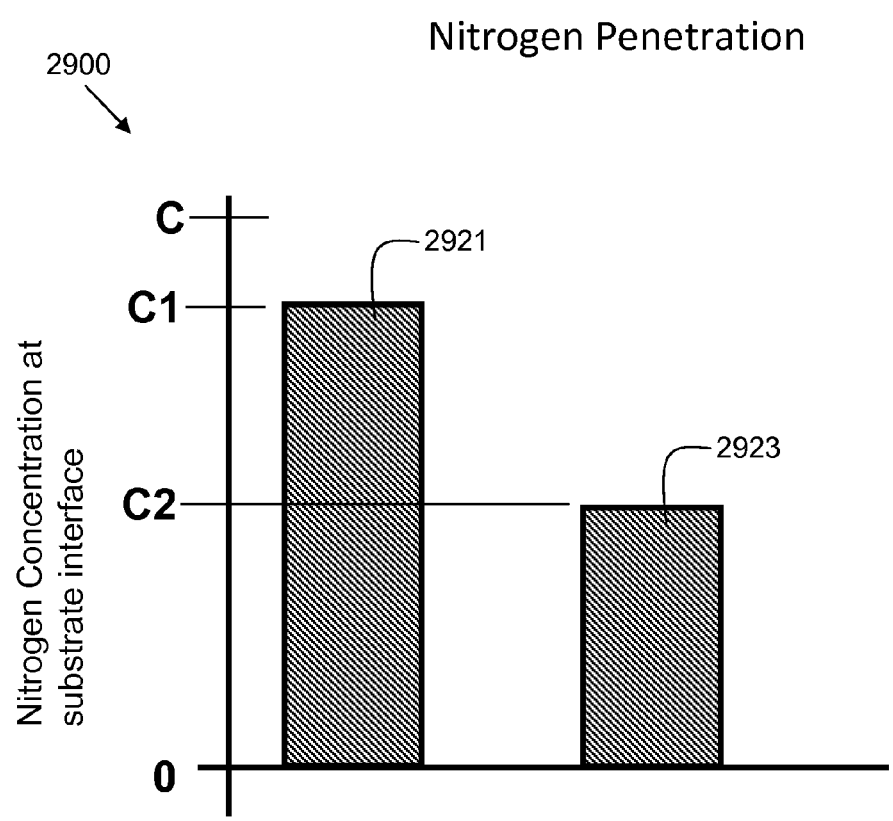

FIG. 29 is a chart showing improved nitrogen penetration characteristics using embodiments of the present invention.

Figure 30A:
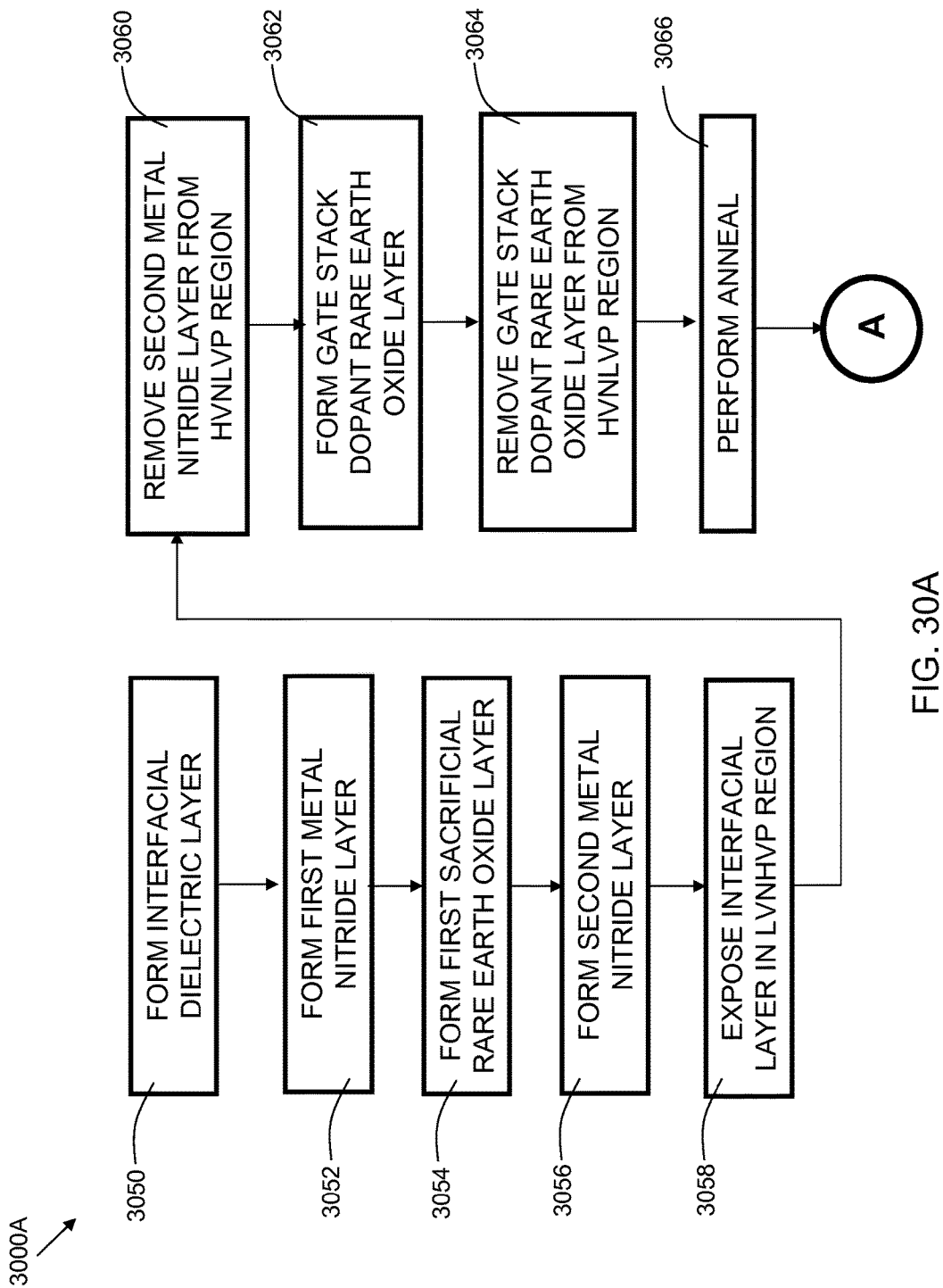
Figure 30B:
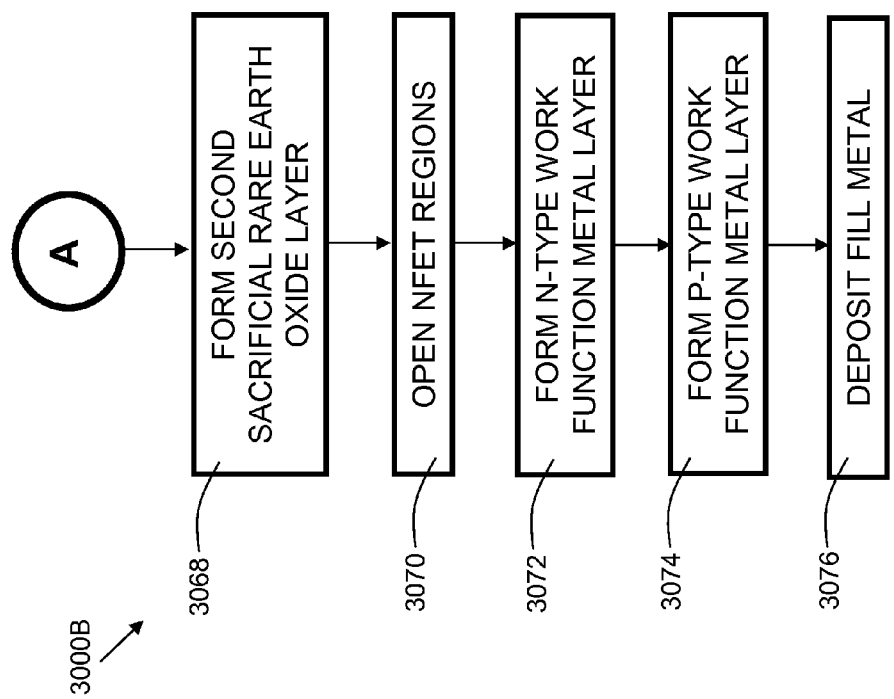

FIG. 30A and FIG. 30B depict a flowchart indicating process steps for embodiments of the present invention.

DETAILED DESCRIPTION

Embodiments of the present invention provide a process that maintains a "keep cap" metal nitride layer on PFET devices within a CMOS structure. The keep cap metal nitride layer is in place while an N-type work function metal is formed on the NFET devices within the CMOS structure. A sacrificial rare earth oxide layer, such as a lanthanum oxide layer is used to facilitate removal of the n-type work function metal selective to the keep cap metal nitride layer. The presence of the keep cap provides various benefits, including, but not limited to, improved Negative Bias Temperature Instability (NBTI), and lower gate resistance due to a smaller total metal thickness for work function layers.

FIG. 1 is a semiconductor structure 100 at a starting point for embodiments of the present invention. Semiconductor structure 100 comprises a semiconductor substrate 102. In embodiments, semiconductor substrate 102 may comprise a silicon substrate. In other embodiments, semiconductor substrate 102 may further include other materials such as germanium. In yet other embodiments, semiconductor substrate 102 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. In embodiments, semiconductor substrate 102 may be a bulk substrate, such as part of a semiconductor wafer. In other embodiments, semiconductor substrate 102 may be disposed over additional insulator layers (not shown) as part of a semiconductor-on-insulator (SOI) structure. Two distinct regions are denoted within structure 100. Region 113 and region 115 each have two subregions within them. Region 113 has a low threshold voltage (Vt) N-type field effect transistor (NFET) subregion 105, and a high Vt P-type field effect transistor (PFET) subregion 107. Similarly, region 115 has a high threshold voltage (Vt) N-type field effect transistor (NFET) subregion 109, and a low Vt P-type field effect transistor (PFET) subregion 111. Within this disclosure, region 113 may be referred to as an LVNHVP (Low Vt NFET, High Vt PFET) region, and region 115 may be referred to as a HVNLVP (High Vt NFET, Low Vt PFET) region.

Disposed on substrate 102 is an interfacial dielectric layer 104. In embodiments, the interfacial dielectric layer 104 is comprised of hafnium oxide. In other embodiments, zirconium oxide may be used for interfacial dielectric layer 104. In embodiments, interfacial dielectric layer 104 may be comprised of a high-K dielectric (k>3.9). In embodiments, the interfacial dielectric layer 104 may be deposited via atomic layer deposition (ALD), chemical vapor deposition (CVD), or other suitable method.

FIG. 2 is a semiconductor structure 200 after a subsequent process step of forming a first metal nitride layer 206 on the interfacial dielectric layer 204. As stated previously, similar elements may be referred to by similar numbers in various figures (FIGs) of the drawing, in which case typically the last two significant digits may be the same. For example, semiconductor substrate 202 of FIG. 2 is similar to semiconductor substrate 102 of FIG. 1. In embodiments, the metal nitride layer 206 may be comprised of a material including, but not limited to, titanium nitride (TiN), titanium carbide (TiC), tantalum carbide (TaC), and/or tantalum nitride (TaN). In embodiments, the metal nitride layer 206 may be deposited using ALD, CVD, or other suitable method. In embodiments, the metal nitride layer 206 has a thickness ranging from about 5 angstroms to about 30 angstroms.

FIG. 3 is a semiconductor structure 300 after a subsequent process step of forming a first sacrificial rare earth oxide layer 308 on the first metal nitride layer 306. In embodiments, the rare earth oxide layer 308 is comprised of lanthanum oxide (LaOx).

FIG. 4 is a semiconductor structure 400 after a subsequent process step of forming a second metal nitride layer 410 on the first sacrificial rare earth oxide layer 408. In embodiments, the metal nitride layer 410 is comprised of titanium nitride. In embodiments, the second metal nitride layer 410 has a thickness ranging from about 5 angstroms to about 30 angstroms. The presence of the second metal nitride layer 410 facilitates improved patterning in subsequent process steps.

FIG. 5 is a semiconductor structure 500 after a subsequent process step of forming a mask 512 on the HVNLVP region of the semiconductor structure 500. In embodiments, the mask 512 is comprised of photoresist, and may be deposited and patterned using industry-standard lithographic techniques.

FIG. 6 is a semiconductor structure 600 after a subsequent process step of removing the second metal nitride layer, the first sacrificial rare earth oxide layer, and the first metal nitride layer from the LVNHVP region. This exposes the interfacial dielectric layer 604 in the LVNHVP region, while the first metal nitride layer 606, first sacrificial rare earth oxide layer 608, and second metal nitride layer 610 remain in the HVNLVP region of the semiconductor structure 600.

FIG. 7 is a semiconductor structure 700 after a subsequent process step of removing the mask on the HVNLVP region of the semiconductor structure (compare with mask 612 of FIG. 6).

FIG. 8 is a semiconductor structure 800 after a subsequent process step of removing the second metal nitride layer (compare with 710 of FIG. 7) from the HVNLVP region. In embodiments, the removal of the second metal nitride layer is performed using a wet etch process that is selective to the rare earth oxide layer 808. In one embodiment, the wet etch process includes an SC1 etch process. The SC1 etch process (standard clean 1) may utilize an etchant comprising water, ammonium hydroxide, and hydrogen peroxide.

FIG. 9 is a semiconductor structure 900 after a subsequent process step of forming a gate stack dopant rare earth oxide layer 914 on the LVNHVP region and HVNLVP region. In embodiments, the gate stack dopant rare earth oxide layer 914 is comprised of lanthanum oxide. In a subsequent process step, an anneal is used to drive dopants into the LVNHVP region. In embodiments, the annealing of the gate stack dopant rare earth oxide, such as lanthanum oxide, causes a drop in threshold voltage in NFET devices, and an increase in threshold voltage in PFET devices.

FIG. 10 is a semiconductor structure 1000 after a subsequent process step of forming a third metal nitride layer, comprising portion 1016 in the LVNHVP region, and comprising portion 1018 in the HVNLVP region. In embodiments, the third metal nitride layer is comprised of titanium nitride. The third metal nitride layer 1016 in the LVNHVP region serves to protect the gate stack dopant rare earth oxide layer 1014 during subsequent process steps.

FIG. 11 is a semiconductor structure 1100 after a subsequent process step of forming a mask 1120 on the LVNHVP region of the semiconductor structure. The mask 1120 protects the layers on the LVNHVP side during removal of layers from the HVNLVP side.

FIG. 12 is a semiconductor structure 1200 after a subsequent process step of removing the third metal nitride layer (compare with 1118 of FIG. 11) from the HVNLVP side. In embodiments, the removal of the third metal nitride layer is performed using a wet etch process. In one embodiment, the wet etch process includes an SC1 etch process. The SC1 etch process (standard clean 1) may utilize an etchant comprising water, ammonium hydroxide, and hydrogen peroxide.

FIG. 13 is a semiconductor structure 1300 after a subsequent process step of removing the gate stack dopant rare earth oxide layer and first sacrificial rare earth oxide layer from the HVNLVP region (compare with 1208 and 1214 of FIG. 12). It is beneficial to remove the gate stack dopant rare earth oxide layer from the HVNLVP region prior to the upcoming anneal step to further reduce the probability of dopant contamination in the HVNLVP region, as the dopants from the gate stack dopant rare earth oxide layer (e.g. lanthanum) have an adverse effect on the threshold voltage of devices in the HVNLVP region (the high Vt NFET and the low Vt PFET). Thus, in embodiments, the interfacial dielectric layer comprises lanthanum dopants in the PFET subregion 1307 of the LVNHVP region and the interfacial dielectric layer is lanthanum-free in the PFET subregion 1311 of the HVNLVP region. Additionally, in embodiments, the interfacial dielectric layer comprises lanthanum dopants in the NFET subregion 1305 of the LVNHVP region and the interfacial dielectric layer is lanthanum-free in the NFET subregion 1309 of the HVNLVP region.

FIG. 14 is a semiconductor structure 1400 after a subsequent process step of removing the mask on the LVNHVP region of the semiconductor structure (compare with 1320 of FIG. 13).

FIG. 15 is a semiconductor structure 1500 after a subsequent process step of depositing a layer of amorphous silicon 1522 on the LVNHVP region and HVNLVP region. The amorphous silicon (a-Si) serves to protect the metal nitride layer 1506 during an upcoming anneal process. In some embodiments, poly-crystalline silicon may be used instead of, or in addition to, the amorphous silicon layer. Thus, embodiments include depositing a layer of amorphous silicon on the LVNHVP region and the HVNLVP region after removing the gate stack dopant rare earth oxide layer from the HVNLVP region and before performing an anneal.

FIG. 16 is a semiconductor structure 1600 after a subsequent process step of performing an anneal. The anneal is performed while the a-Si layer 1622 covers the structure 1600. As a result of the anneal, dopants are diffused into the substrate 1602, as indicated by doped region 1617. The metal nitride layer 1606 provides protection for the HVNLVP region during the anneal. In embodiments, the anneal process conditions may include a process temperature ranging from about 950 degrees Celsius to about 1100 degrees Celsius, for a duration ranging from about 1 seconds to about 10 seconds. In embodiments, the anneal may be a spike anneal where temperatures ramp up and down quickly and the duration at the maximum temperature is almost zero. The anneal process may further include a second anneal that is performed as a millisecond anneal using a flash lamp or a laser. In embodiments, the second anneal may be performed at temperatures ranging from about 1100 degrees Celsius to about 1300 degrees Celsius. The dopants in region 1617 that reside in the LVNHVP region of the semiconductor structure 1600 serve to lower the voltage threshold of a transistor formed in the low Vt NFET subregion 1605 and conversely serves to raise the voltage threshold of a transistor formed in the high Vt PFET subregion 1607. The ability to create both high Vt and low Vt transistors in close proximity allows a circuit designer to create designs that utilize low Vt transistors where fast switching is desired, and high Vt transistors where low leakage is desired.

FIG. 17 is a semiconductor structure 1700 after a subsequent process step of removing the layer of amorphous silicon (compare with 1622 of FIG. 16) on the LVNHVP region and HVNLVP region. In embodiments, the removal of the amorphous silicon layer may be performed using a hot ammonia process. This process is selective, and does not significantly etch the nitride layers 1706 and 1716.

FIG. 18 is a semiconductor structure 1800 after a subsequent process step of forming a second sacrificial rare earth oxide layer 1824 on the LVNHVP region and HVNLVP region. In embodiments, sacrificial rare earth oxide layer 1824 is comprised of lanthanum oxide.

FIG. 19 is a semiconductor structure 1900 after a subsequent process step of forming a fourth metal nitride layer 1926 over the second sacrificial rare earth oxide layer 1924. In embodiments, the metal nitride layer 1926 is comprised of titanium nitride. In embodiments, the layer 1926 may have a thickness ranging from about 20 angstroms to about 40 angstroms. The rare earth oxide layer 1924 and metal nitride layer 1926 serve to protect portions of the structure and increase the quality of subsequent patterning steps.

FIG. 20 is a semiconductor structure 2000 after a subsequent process step of exposing the interfacial dielectric layer 2004 in an HVNLVP NFET subregion 2009 and an LVNHVP NFET subregion 2005. This may be performed by depositing mask regions (not shown) in the subregion 2007 and subregion 2011, followed by one or more etch steps to remove materials from subregion 2005 and subregion 2009, which correspond to NFET regions. The metal nitride layer 2026 disposed in the HVNLVP PFET subregion 2011 and LVNHVP PFET subregion 2007 serve to protect those regions from nitrogen ingress during subsequent metal deposition steps. This protection can provide a significant improvement in Negative Bias Temperature Instability (NBTI) for the PFET devices.

FIG. 21 is a semiconductor structure 2100 after a subsequent process step of removing the fourth metal nitride layer (compare with 2026 of FIG. 20). As a result, sacrificial rare earth oxide layer 2124 is exposed in the subregion 2107 and subregion 2111, which correspond to PFET regions. The rare earth oxide layer 2124 serves as an etch stop layer in a subsequent process step.

FIG. 22 is a semiconductor structure 2200 after a subsequent process step of forming an N-type work function metal layer 2230 in the HVNLVP NFET subregion 2205 and the LVNHVP NFET subregion 2209. In embodiments, the N-type work function metal layer may be deposited via atomic layer deposition (ALD), physical layer deposition (PVD), or other suitable method. As can be seen, embodiments provide an nFWM-first process flow, meaning that the N-type work function metal is formed/deposited prior to the forming/depositing of the P-type work function metal layer. As shown in FIG. 22, the N-type work function metal layer 2230 is also disposed in the HVNLVP PFET subregion 2211 and the LVNHVP PFET subregion 2207. However, the N-type work function metal layer 2230 will get removed from those regions in a subsequent process step, prior to formation of the P-type work function metal layer. In some embodiments, the P-type work function metal layer is comprised of titanium nitride. In other embodiments, the P-type work function metal comprises a material selected from the group consisting of: rhenium, ruthenium, osmium, nickel, palladium, tungsten, tantalum, and platinum.

FIG. 23 is a detailed view of an N-type work function metal layer stack 2330 in accordance with some embodiments. In embodiments, the N-type work function metal layer such as that depicted by layer 2230 in FIG. 22 may in fact comprise multiple sub-layers. In embodiments, the N-type work function metal layer is comprised of three sub-layers. In embodiments, the first sub-layer 2341 may comprise a first titanium nitride layer, the second sub-layer 2343 may comprise titanium carbide (TiC) or titanium aluminum carbide (TiAlC), and the third sublayer 2345 may be comprised of a second titanium nitride layer. In embodiments, these sub-layers together serve as the N-type work function metal layer.

FIG. 24 is a semiconductor structure 2400 after a subsequent process step of forming a mask on the HVNLVP NFET subregion 2409 and the LVNHVP NFET subregion 2405. In embodiments, mask regions 2432 are comprised of photoresist and are formed using industry-standard deposition and lithographic techniques.

FIG. 25 is a semiconductor structure 2500 after a subsequent process step of removing the N-type work function metal layer from the HVNLVP PFET subregion and the LVNHVP PFET subregion (compare with regions 2230 in subregions 2207 and 2211 of FIG. 22). The sacrificial rare earth oxide layer is also removed (compare with 2026 of FIG. 20). In embodiments, a first etch process may be used to remove the N-type work function metal layer, followed by a second etch process to remove the sacrificial rare earth oxide layer. Hence, as a result of these processes, the N-type work function metal is not disposed in the HVNLVP PFET subregion 2511 and the LVNHVP PFET subregion 2507.

FIG. 26 is a semiconductor structure 2600 after a subsequent process step of removing the mask on the HVNLVP NFET subregion and the LVNHVP NFET subregion (compare with 2532 of FIG. 25).

FIG. 27 is a semiconductor structure 2700 after a subsequent process step of forming a P-type work function metal layer 2732 in the HVNLVP PFET subregion 2711 and the LVNHVP PFET subregion 2707. In embodiments, the P-type work function metal layer 2732 may be comprised of titanium nitride. The P-type work function metal layer 2732 may be of a different thickness and/or material than the N-type work function metal layer 2730.

FIG. 28 is a semiconductor structure 2800 after a subsequent process step of depositing a fill metal 2838 on the LVNHVP region and HVNLVP region. In embodiments, the fill metal 2838 may comprise tungsten. In other embodiments, the fill metal 2838 may comprise aluminum.

FIG. 29 is a chart 2900 showing improved nitrogen penetration characteristics using embodiments of the present invention. Bar 2921 shows a nitrogen level of C1 at the interface between the interfacial dielectric layer and the semiconductor substrate using prior art processes. Bar 2923 shows a nitrogen level of C2 at the interface between the interfacial dielectric layer and the semiconductor substrate using processes in accordance with embodiments of the present invention. In embodiments, nitrogen concentration C2 is less than nitrogen concentration C1. Nitrogen can cause adverse effects such as degradation of device reliability. For example, nitrogen can cause degradation of device reliability for pFET, or negative bias temperature instability (NBTI), when it penetrates through gate oxides and reaches the Si substrate. This results in shifts of threshold voltage of pFET over time. Hence, embodiments of the present invention reduce nitrogen penetration at the substrate interface and serve to improve device reliability.

FIG. 30A and FIG. 30B depict a flowchart 3000A and flowchart 3000B indicating process steps for embodiments of the present invention. Starting from FIG. 30A with flowchart 3000A, in process step 3050, an interfacial dielectric layer is formed (see 104 of FIG. 1). In process step 3052, a first metal nitride layer is formed (see 206 of FIG. 2). In process step 3054, a first sacrificial rare earth oxide is formed (see 308 of FIG. 3). In process step 3056, a second metal nitride layer is formed (see 410 of FIG. 4). In process step 3058, the interfacial layer is exposed in the LVNHVP region (see 600 of FIG. 6). In process step 3060, the second metal nitride layer is removed from the HVNLVP region (see 800 of FIG. 8). In process step 3062, a gate stack dopant rare earth oxide layer is formed (see 914 of FIG. 9). In process step 3064, the gate stack dopant rare earth oxide layer is removed from the HVNLVP region (see 1300 of FIG. 13). In process step 3066, an anneal is performed to drive dopants into the LVNHVP region (see 1617 of FIG. 16). Continuing on FIG. 30B with flowchart 3000B, which is a continuation of flowchart 3000A, in process step 3068, a second sacrificial rare earth oxide layer is formed (see 1824 of FIG. 18). In process step 3070, the NFET regions are opened to expose the interfacial dielectric layer (see subregion 2005 and subregion 2009 of FIG. 20). In process step 3072, an N-type work function metal layer is formed (see 2230 of FIG. 22). In process step 3074, a P-type work function metal layer is formed (see 2732 of FIG. 27). In process step 3076, a fill metal is deposited (see 2838 of FIG. 28). From this point forward, industry-standard techniques may be used to complete the fabrication of an integrated circuit (IC) incorporating structures disclosed in accordance with embodiments of the present invention. Subsequent processing steps may include, but are not limited to, additional patterning, gate spacer formation, formation of middle-of-line and back-end-of-line layers (including metallization layers, dielectric layers, via layers, and/or contact structures), packaging, and testing.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:
    forming an interfacial dielectric layer on a semiconductor substrate, wherein the semiconductor substrate comprises a HVNLVP region and a LVNHVP region;
    forming a first metal nitride layer on the interfacial dielectric layer;
    forming a first sacrificial rare earth oxide layer on the first metal nitride layer;
    forming a second metal nitride layer on the first sacrificial rare earth oxide layer;
    removing the second metal nitride layer, the first sacrificial rare earth oxide layer, and the first metal nitride layer from the LVNHVP region to expose the interfacial dielectric layer, wherein the removing the second metal nitride layer, the first sacrificial rare earth oxide layer, and the first metal nitride layer from the LVNHVP region to expose the interfacial dielectric layer includes removing an entirety of the second metal nitride layer, the first sacrificial rare earth oxide layer, and the first metal nitride layer from the LVNHVP region to expose the interfacial dielectric layer;
    removing the second metal nitride layer from the HVNLVP region;
    forming a gate stack dopant rare earth oxide layer on the LVNHVP region and the HVNLVP region;
    removing the gate stack dopant rare earth oxide layer from the HVNLVP region;
    performing an anneal;
    forming a second sacrificial rare earth oxide layer on the LVNHVP region and the HVNLVP region;
    exposing the interfacial dielectric layer in an HVNLVP NFET subregion and an LVNHVP NFET subregion;
    forming an N-type work function metal layer in the HVNLVP NFET subregion and the LVNHVP NFET subregion; and
    forming a P-type work function metal layer in an HVNLVP PFET subregion and an LVNHVP PFET subregion.

2. The method of claim 1, wherein forming an interfacial dielectric layer comprises forming a dielectric layer comprising hafnium oxide, wherein forming a first metal nitride layer comprises forming a titanium nitride layer, wherein forming a first sacrificial rare earth oxide layer comprises forming a lanthanum oxide layer, and wherein forming a gate stack dopant rare earth oxide layer comprises forming a lanthanum oxide layer.

3. The method of claim 1, wherein forming a P-type work function metal layer comprises forming a layer comprising an elemental metal.

4. The method of claim 1, further comprising depositing a layer of amorphous silicon on the LVNHVP region and the HVNLVP region after removing the gate stack dopant rare earth oxide layer from the HVNLVP region and before performing the anneal.

5. The method of claim 4, further comprising removing the amorphous silicon layer after performing the anneal.

6. The method of claim 1, further comprising depositing a fill metal on the LVNHVP region and the HVNLVP region.

7. The method of claim 1, wherein the removing the second metal nitride layer, the first sacrificial rare earth oxide layer, and the first metal nitride layer from the LVNHVP region to expose the interfacial dielectric layer includes removing the second metal nitride layer, the first sacrificial rare earth oxide layer, and the first metal nitride layer selectively from the LVNHVP region to expose the interfacial dielectric layer.

8. The method of claim 1, wherein the forming a second metal nitride layer on the first sacrificial rare earth oxide layer is performed subsequent to the forming a first sacrificial rare earth oxide layer on the first metal nitride layer.

9. A method of forming a semiconductor structure, comprising:

forming an interfacial dielectric layer on a semiconductor substrate, wherein the semiconductor substrate comprises a HVNLVP region and a LVNHVP region;

forming a first metal nitride layer on the interfacial dielectric layer;

forming a first sacrificial rare earth oxide layer on the first metal nitride layer;

forming a second metal nitride layer on the first sacrificial rare earth oxide layer;

removing an entirety of the second metal nitride layer, the first sacrificial rare earth oxide layer, and the first metal nitride layer selectively from the LVNHVP region;

removing the second metal nitride layer from the HVNLVP region;

forming a gate stack dopant rare earth oxide layer on the LVNHVP region and the HVNLVP region;

removing the gate stack dopant rare earth oxide layer from the HVNLVP region;

performing an anneal;

forming a second sacrificial rare earth oxide layer on the LVNHVP region and the HVNLVP region;

exposing the interfacial dielectric layer in an HVNLVP NFET subregion and an LVNHVP NFET subregion;

forming an N-type work function metal layer in the HVNLVP NFET subregion and the LVNHVP NFET subregion; and forming a P-type work function metal layer in an HVNLVP PFET subregion and an LVNHVP PFET subregion.

10. The method of claim 9, wherein the performing an anneal includes performing the anneal to drive dopants of the gate stack dopant rare earth oxide layer into the substrate in the LVNHVP region.

11. The method of claim 9, wherein the removing the second metal nitride layer from the HVNLVP region includes removing an entirety of the second metal nitride layer from the HVNLVP region.

12. The method of claim 9, wherein the forming a first sacrificial rare earth oxide layer on the first metal nitride layer includes performing the forming a first sacrificial rare earth oxide layer on the first metal nitride layer subsequent to the forming a first metal nitride layer on the interfacial dielectric layer, and wherein the forming a first sacrificial rare earth oxide layer on the first metal nitride layer includes forming the first sacrificial rare earth oxide layer on the first metal nitride layer so that the first sacrificial rare earth oxide layer is adjacent to the first metal nitride layer.

13. The method of claim 9, wherein the forming a second metal nitride layer on the first sacrificial rare earth oxide layer includes depositing the second metal nitride layer on the first sacrificial rare earth oxide layer so that the second metal nitride layer is adjacent to the first sacrificial rare earth oxide layer.

14. The method of claim 9, wherein the forming an interfacial dielectric layer on a semiconductor substrate includes depositing the interfacial dielectric layer on a semiconductor substrate so that the interfacial dielectric layer is adjacent to the semiconductor substrate.

15. The method of claim 9, wherein the removing the second metal nitride layer from the HVNLVP region includes removing an entirety of the second metal nitride layer from the HVNLVP region to expose a top surface of the first sacrificial rare earth oxide layer so that on completion of the removing an entirety of the second metal nitride layer from the HVNLVP region the top surface of the first sacrificial rare earth oxide layer is exposed, wherein the forming a first sacrificial rare earth oxide layer on the first metal nitride layer includes performing the forming a first sacrificial rare earth oxide layer on the first metal nitride layer subsequent to the forming a first metal nitride layer on the interfacial dielectric layer, and wherein the forming a first sacrificial rare earth oxide layer on the first metal nitride layer includes forming the first sacrificial rare earth oxide layer on the first metal nitride layer so that the first sacrificial rare earth oxide layer is adjacent to the first metal nitride layer, wherein the forming a second metal nitride layer on the first sacrificial rare earth oxide layer includes forming the second metal nitride layer on the first sacrificial rare earth oxide layer so that the second metal nitride layer is adjacent to the first sacrificial rare earth oxide layer, and wherein the forming an interfacial dielectric layer on a semiconductor substrate includes depositing the interfacial dielectric layer on a semiconductor substrate so that the interfacial dielectric layer is adjacent to the semiconductor substrate.

16. The method of claim 9, further comprising depositing a layer of amorphous silicon on the LVNHVP region and the HVNLVP region after removing the gate stack dopant rare earth oxide layer from the HVNLVP region and before performing the anneal.

17. A method of forming a semiconductor structure, comprising:

forming an interfacial dielectric layer on a semiconductor substrate, wherein the semiconductor substrate comprises a HVNLVP region and a LVNHVP region;

forming a first metal nitride layer on the interfacial dielectric layer;

forming a first sacrificial rare earth oxide layer on the first metal nitride layer;

forming a second metal nitride layer on the first sacrificial rare earth oxide layer;

removing the second metal nitride layer, the first sacrificial rare earth oxide layer, and the first metal nitride layer from the LVNHVP region to expose the interfacial dielectric layer, wherein the removing the second metal nitride layer, the first sacrificial rare earth oxide layer, and the first metal nitride layer from the LVNHVP region to expose the interfacial dielectric layer includes removing the second metal nitride layer, the first sacrificial rare earth oxide layer, and the first metal nitride layer from the LVNHVP region to expose a top surface of the interfacial dielectric layer;

removing the second metal nitride layer from the HVNLVP region;

forming a gate stack dopant rare earth oxide layer on the LVNHVP region and the HVNLVP region;

removing the gate stack dopant rare earth oxide layer from the HVNLVP region;

performing an anneal;

forming a second sacrificial rare earth oxide layer on the LVNHVP region and the HVNLVP region;

exposing the interfacial dielectric layer in an HVNLVP NFET subregion and an LVNHVP NFET subregion;

forming an N-type work function metal layer in the HVNLVP NFET subregion and the LVNHVP NFET subregion; and forming a P-type work function metal layer in an HVNLVP PFET subregion and an LVNHVP PFET subregion.

18. The method of claim 17, wherein the forming a gate stack dopant rare earth oxide layer on the LVNHVP region and the HVNLVP region includes forming a gate stack dopant rare earth oxide layer on the exposed top surface of the interfacial layer of the LVNHVP region.

19. The method of claim 17, wherein the removing the second metal nitride layer from the HVNLVP region includes removing an entirety of the second metal nitride layer from the HVNLVP region to expose a top surface of the first sacrificial rare earth oxide layer so that on completion of the removing an entirety of the second metal nitride layer from the HVNLVP region the top surface of the first sacrificial rare earth oxide layer is exposed.

20. The method of claim 17, wherein the forming a second metal nitride layer on the first sacrificial rare earth oxide layer is performed subsequent to the forming a first sacrificial rare earth oxide layer on the first metal nitride layer, and wherein the forming a first sacrificial rare earth oxide layer on the first metal nitride layer is performed subsequent to the forming a first metal nitride layer on the interfacial dielectric layer.

* * * * *

UNITED STATES PATENT AND TRADEMARK OFFICE
CERTIFICATE OF CORRECTION

PATENT NO. : 10,062,618 B2
APPLICATION NO. : 14/721402
DATED : August 28, 2018
INVENTOR(S) : Ando et al.

Page 1 of 1

It is certified that error appears in the above-identified patent and that said Letters Patent is hereby corrected as shown below:

On the Title Page

In the Assignee (73):
Delete "GLOBALFOUNDRIES INC., Grandy Cayman (KY)" and insert -- GLOBALFOUNDRIES INC., Grand Cayman (KY) --

Signed and Sealed this
Ninth Day of October, 2018

Andrei Iancu
*Director of the United States Patent and Trademark Office*